United States Patent
Xu et al.

(10) Patent No.: US 10,793,972 B1
(45) Date of Patent: Oct. 6, 2020

(54) HIGH QUALITY SILICON CARBIDE CRYSTALS AND METHOD OF MAKING THE SAME

(71) Applicant: II-VI Delaware, Inc., Wilmington, DE (US)

(72) Inventors: Xueping Xu, Westport, CT (US); Avinash Gupta, Basking Ridge, NJ (US); Mark Ramm, Richmond Hill, NY (US); Ilya Zwieback, Washington Township, NJ (US); Varatharajan Rengarajan, Flanders, NJ (US); Gary E. Ruland, Oakland, NJ (US)

(73) Assignee: II-VI Delaware, Inc., Wilmington, DE (US)

( * ) Notice: Subject to any disclaimer, the term of this patent is extended or adjusted under 35 U.S.C. 154(b) by 137 days.

(21) Appl. No.: 16/031,917

(22) Filed: Jul. 10, 2018

Related U.S. Application Data

(60) Provisional application No. 62/531,233, filed on Jul. 11, 2017.

(51) Int. Cl.
   *C30B 23/06* (2006.01)
   *C30B 29/36* (2006.01)
(52) U.S. Cl.
   CPC .............. *C30B 29/36* (2013.01); *C30B 23/06* (2013.01)
(58) Field of Classification Search
   CPC .......... C30B 23/00; C30B 23/04; C30B 23/06
   See application file for complete search history.

(56) References Cited

U.S. PATENT DOCUMENTS

| | | | |
|---|---|---|---|
| 5,856,231 | A | 1/1999 | Niemann et al. |
| 6,063,185 | A | 5/2000 | Hunter |
| 6,214,108 | B1 | 4/2001 | Okamoto et al. |
| 6,451,112 | B1 | 9/2002 | Hara et al. |
| 8,936,680 | B2 | 1/2015 | Katsuno et al. |
| 9,200,381 | B2 | 12/2015 | Leonard et al. |
| 9,340,898 | B2 | 5/2016 | Chen et al. |
| 2012/0103249 | A1 | 5/2012 | Gupta et al. |
| 2013/0000547 | A1 | 1/2013 | Kogoi |
| 2015/0068446 | A1 | 3/2015 | Drachev et al. |
| 2015/0255279 | A1 | 9/2015 | Sasaki |
| 2015/0361580 | A1 | 12/2015 | Huang et al. |
| 2016/0083865 | A1 | 3/2016 | Sakurada et al. |

FOREIGN PATENT DOCUMENTS

| EP | 0 663 023 | 7/1995 |
|---|---|---|

*Primary Examiner* — Robert M Kunemund
(74) *Attorney, Agent, or Firm* — Wendy W. Koba

(57) ABSTRACT

A physical vapor transport (PVT) apparatus suitable for growing SiC boules comprises a crystal growth chamber (with a defined central vertical axis), a sealed crucible containing sublimation source material and including a seed fixture disposed in an offset position with respect to the central vertical axis of the apparatus, and a heat source disposed to surround the crystal growth chamber. The heat source is configured to raise the temperature within the sealed crucible such that the source material vaporizes and deposits on the seed wafer. The offset position of the seed fixture creates a radial temperature gradient across an exposed surface of the seed as the crystal boule is grown.

18 Claims, 9 Drawing Sheets

(a)

(b)

(c)

HIGH QUALITY SILICON CARBIDE CRYSTALS AND METHOD OF MAKING THE SAME

CROSS-REFERENCE TO RELATED APPLICATIONS

This application claims the benefit of U.S. Provisional Application No. 62/531,233, filed Jul. 11, 2017, and herein incorporated by reference.

BACKGROUND OF THE INVENTION

Silicon carbide (SiC) single crystals are increasingly used in semiconductor, electronic, and optoelectronic devices, such as high power/high frequency diodes and transistors, ultra-fast semiconductor optical switches, detectors working in harsh environments, and the like. Large crystals of SiC have been conventionally prepared using a physical vapor transport (PVT) method. For this method, a source such as powdered silicon carbide, is provided in a high temperature region of a crystal growth furnace and heated. A "seed", such as a single-crystal silicon carbide wafer, is provided and positioned in a lower temperature region of the furnace. The powdered silicon carbide is heated to sublime, and the resulting vapors reach the cooler silicon carbide seed and deposit on its exposed surface to initiate crystal growth. The vapors continue to interact with the newly-deposited material to continue the growth process to form a boule of appropriate size. In some cases, the growth system contains dopants that are used to alter the characteristics of the grown crystals.

While relatively large-sized boules of silicon carbide can be produced in this manner, the quality of the boule is impacted by various process parameters that are difficult to control. For example, it is critical that the process conditions, such as the temperature gradient between the source and the seed, be held constant throughout the crystal growth process (which may take place over several days, at temperatures in excess of 2000° C.). Even relatively small variations in process conditions can result in large changes in the quality of the grown silicon carbide boule.

For these and other reasons, silicon carbide crystals grown by sublimation often contain defects, such as low angle grain boundaries, dislocations, Si and C secondary phase inclusions, different polytype inclusions and micropipes, all of which affect the performance properties of the material. Furthermore, even if specific conditions can be maintained for a single crystal growth process to produce a high quality product, run-to-run variability is often found to exist, for the reasons described above.

There is a continuing need for higher quality silicon carbide single crystals, as well as an improved silicon carbide growth apparatus and method.

SUMMARY OF THE INVENTION

The present invention relates to high quality bulk single crystals of silicon carbide, as well as a method and apparatus for forming the high quality bulk single crystal silicon carbide. As will be described below, the inventive technique utilizes a seed location which is offset with respect to the central vertical axis of the furnace. This offset configuration has been found to improve the quality of the grown crystal.

An exemplary embodiment of the present invention takes the form of physical vapor transport (PVT) apparatus suitable for growing SiC boules, the apparatus comprising a crystal growth chamber (with a defined central vertical axis), a sealed crucible containing sublimation source material and including a seed fixture disposed above the sublimation source material and disposed in an offset position with respect to the central vertical axis of the apparatus, and a heat source disposed to surround the crystal growth chamber. The heat source is configured to raise the temperature within the sealed crucible such that the source material vaporizes and deposits on the seed wafer, the offset position of the seed fixture providing a radial temperature gradient across an exposed surface of the seed as the crystal boule is grown.

Another embodiment of the present invention provides a method of growing silicon carbide single crystal boules from a single crystal seed wafer. One exemplary method includes the steps of: positioning a crucible loaded with sublimation source material into a crystal growth chamber (the crystal growth chamber having a central vertical axis); loading at least one single crystal seed wafer onto a seed fixture; positioning the loaded seed fixture in the crucible in a manner such that the loaded seed fixture is offset from the central vertical axis of the crystal growth chamber; sealing the crucible; and heating the crystal growth chamber to a temperature sufficient to initiate sublimation of the source material and create vapors that rise and deposit on an exposed surface of the seed wafer and result in growing the boule, the heating creating a radial temperature gradient across the exposed surface of the seed wafer related to the offset location of the seed fixture with respect to the central vertical axis of the crystal growth chamber.

Other and further aspects and embodiments of the present invention will become apparent during the course of the following discussion and by reference to the accompanying drawings.

BRIEF DESCRIPTION OF THE DRAWINGS

Referring now to the drawings, where like numerals represent like elements in several views.

DETAILED DESCRIPTION

Prior to describing the details of the inventive technique, a brief review of a typical growth process is provided.

Figure 1:
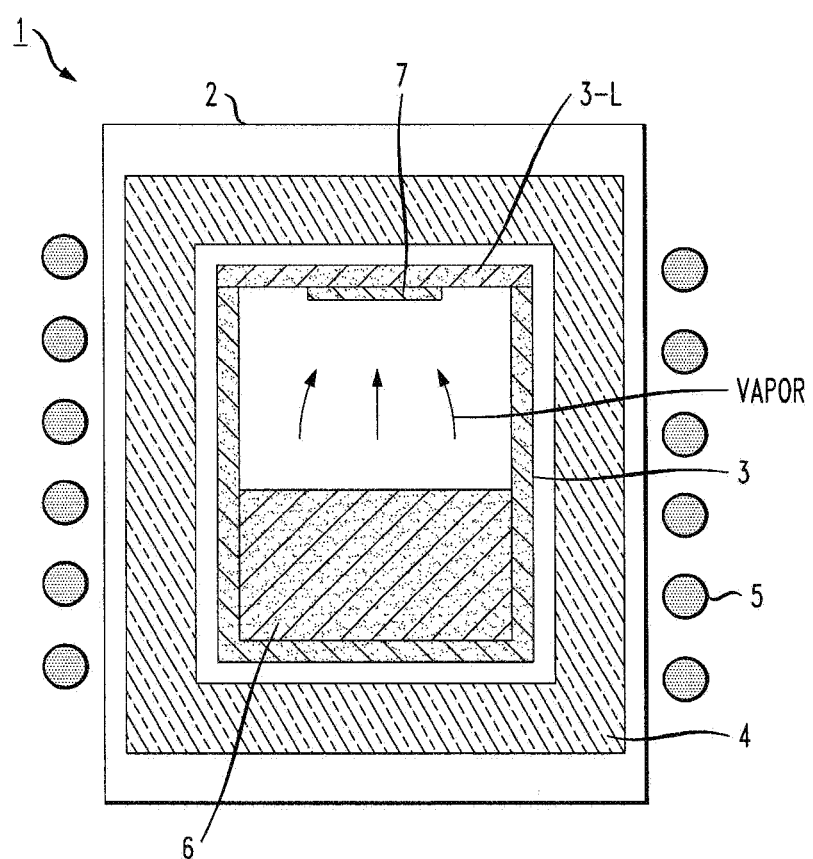
FIG. 1 is a simplified view of a prior art furnace used for PVT growth of single crystal SiC.

FIG. 1 is a simplified view of a typical prior art furnace 1 used to provide PVT growth of single crystal SiC. A crystal growth chamber 2 is used to house a crucible 3 within which the actual crystal growth takes place. An envelope of thermal insulation 4 is disposed to surround the exterior of crucible 3 and is positioned between growth chamber 2 and crucible 3 in the manner shown in the drawing. The high temperatures necessary for crystal growth (typically between about 2000° C. and 2400° C.) are provided by a heating arrangement, represented by inductive RF coil sections 5 in this view.

Turning now to the actual elements used to perform crystal growth, a sublimation source material 6 (such as powdered SiC) is loaded into a lower region of cylindrical crucible 3, and a single crystal SiC seed 7 is disposed at the top of crucible 3, directly over source material 6 and centered with respect to the central vertical axis of the overall cylindrical growth arrangement. Once these materials are in place, the heating apparatus is activated and the temperature within crucible 3 begins to rise and reaches the level necessary to trigger sublimation of source material 6. In particular, a temperature gradient is created along the central vertical axis between source material 6 and SiC seed 7 such that the temperature of sublimation source material 6 is maintained at a level higher than that in the region of seed 7.

Figure 2:
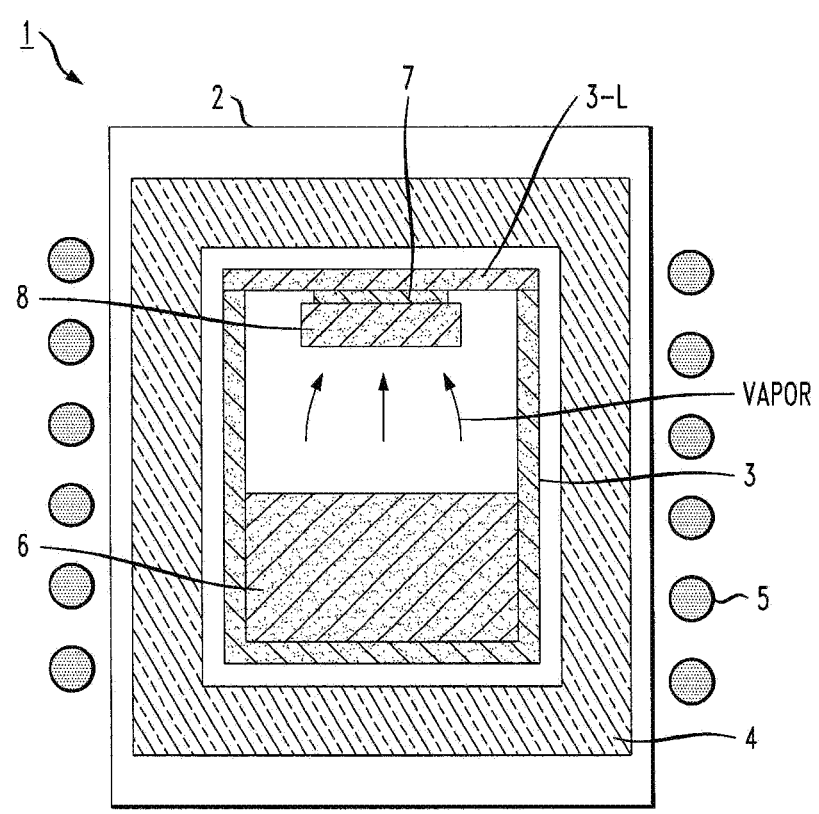
FIG. 2 illustrates the same prior art apparatus as FIG. 1, here illustrating the growth of single crystal material on the initial seed crystal.

In particular, the temperature of crucible 3 in the region of source material 6 is increased until sublimation begins, with source material 6 vaporizing and filling crucible 3 (represented by arrows in FIG. 1). The temperature difference between the lower and upper regions of crucible 3 forces the vapor to migrate and condense on seed crystal 7, initiating growth of a SiC single crystal on SiC single crystal seed 7. FIG. 2 illustrates the same apparatus as that of FIG. 1, in this case showing the growth of a single crystal 8 of SiC as it is growing on SiC single crystal seed crystal 7.

Generally, SiC crystals grown using this basic PVT arrangement suffer from numerous defects, stress, and cracking. To this end, it is difficult to grow long boules of single crystal SiC using conventional PVT due to carbonization of sublimation source 6 and subsequent massive incorporation of carbon inclusions in single crystal 8. Cracking becomes a major yield loss when the conventional PVT technique is utilized to grow large-diameter SiC single crystals.

Inclusions in PVT-grown crystals, e.g., single crystal 8, include carbon inclusions (particles), silicon droplets, and foreign polytypes. Carbon particles in single crystal 8 can be traced to SiC sublimation source 6, as well as to the graphite forming crucible 3. Specifically, silicon carbide sublimes incongruently and produces a silicon-rich vapor and carbon residue in the form of very fine carbon particles. During growth of single crystal 8, these fine particles become airborne and, transferred by the flow of the vapor, incorporate into the growing structure of single crystal 8. Massive carbon incorporation into single crystal 8 is known to take place at the end of the growth of single crystal 8 when a large amount of carbon residue is present in crucible 3.

Additionally, silicon inclusions (droplets) may form at the beginning of the growth process, when sublimation source material 6 source is fresh. In this case, the vapor over sublimation source 6 may contain a too high fraction of silicon, which can cause the formation of Si liquid on the growth interface of single crystal 8 and incorporation of Si droplets into single crystal 8. A large number of polytypic modifications of silicon carbide exist, and inclusion of foreign polytypes in sublimation-grown 4H and 6H single crystal 8 is common. The origin of polytypic inclusions is often tied to the appearance of macrosteps on the growth interface of single crystal 8. The facets formed on the macrosteps are not stable against stacking faults. These stacking faults latter evolve during growth of single crystal 8 into foreign polytypes in single crystal 8.

Three types of dislocations can generally exist in SiC single crystal grown by PVT: threading screw dislocations, threading edge dislocations, and basal plane dislocations. The lines of the threading dislocations tend to position along the crystallographic c-direction, which is often used as a growth direction of SiC single crystals. Basal plane dislocations are dislocations with their lines parallel to the basal c-plane. A micropipe is a threading screw dislocation with a large Burgers vector. When the Burgers vector exceeds (2-3)c, the crystal relieves the stress caused by the dislocation by forming a hollow core, with a core diameter that measures from a fraction of a micron to values reaching 100 microns.

Upon nucleation, growing SiC single crystal inherits some of the dislocations from seed crystal 7. During growth of SiC single crystal 8, micropipes and dislocations participate in reactions with other micropipes and dislocations. This leads to a progressive reduction in the micropipe/dislocation densities during growth. In the case of growth disturbance, such as incorporation of a carbon particle or foreign polytype, new micropipes and dislocations are generated. It has been observed that the magnitude of growth-related stress increases with the increase in the length and diameter of a SiC single crystal boule formed by the growth of SiC single crystal 8. More specifically, SiC single crystal 8 grown by conventional PVT exhibits nonuniform thermoelastic stress and its shear component often exceeds the critical value of 1.0 MPa leading to plastic deformation. Plastic deformation occurs via generation, multiplication and movement of dislocations. Unresolved stress accumulated during growth of a boule of SiC single crystal can lead to cracking of the boule during cooling of the boule to room temperature or during subsequent wafer fabrication.

Figure 3:
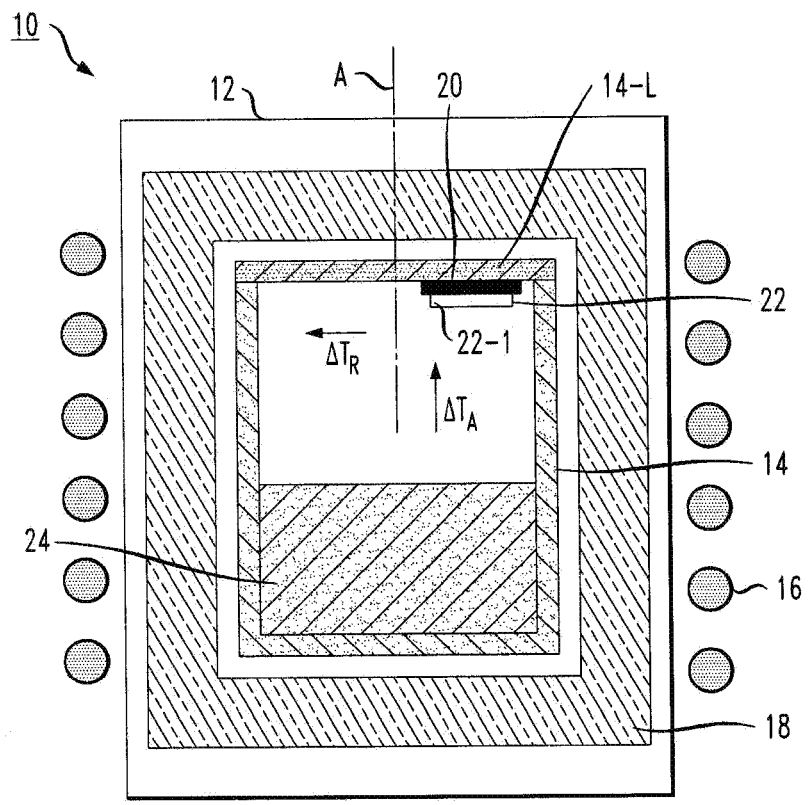
FIG. 3 illustrates an exemplary PVT growth apparatus formed in accordance with the present invention such that the initial seed crystal is displaced from the central vertical axis of the growth apparatus.

FIG. 3 illustrates an exemplary PVT growth apparatus 10 formed in accordance with the present invention to address various crystal quality concerns associated with prior art processes. Apparatus 10 is shown as including various components similar to those of the prior art as described above. In particular, apparatus 10 comprises a crystal growth chamber 12 with a cylindrical crucible 14 for growing large, high quality boules of single crystal SiC. A heat source 16 (for example, inductive RF coils) is also shown in FIG. 3, with thermal insulation material 18 disposed to surround crucible 14. Other types of heat sources may be used in the inventive apparatus, for example, resistive heating.

In accordance with the principles of the present invention, it has been found that displacing the single crystal seed from its strictly axial (conventional) position improves the quality of the grown crystal boule. FIG. 3 illustrates an exemplary embodiment of the present invention, depicting a single crystal seed displaced from a central vertical axis of the cylindrical crystal growth apparatus. Referring to FIG. 3, a seed fixture 20 is shown as positioned offset from central vertical axis A of crucible 14. At least one single crystal SiC seed 22 is held within fixture 20, facing downward toward a sublimation source material 24 that had been loaded into crucible 14. Sublimation source material 24 may comprise polycrystalline SiC grain that has been synthesized in a separate process. In one embodiment, fixture 20 may be attached to an underside of a lid portion 14-L of crucible 14.

Figure 4:
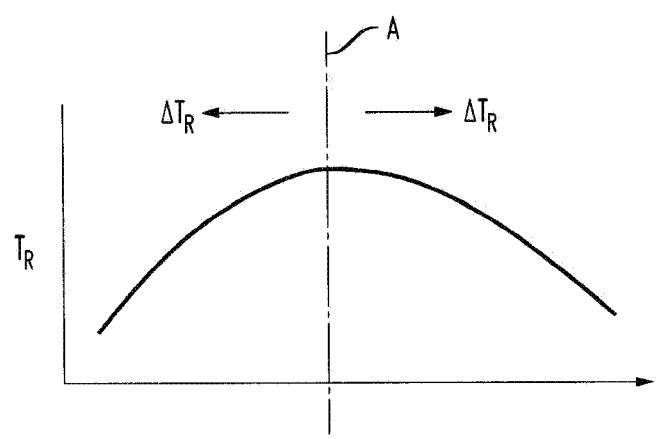
FIG. 4 is a diagram illustrating the radial component of the temperature gradient within the crucible of the apparatus shown in FIG. 3.

As with prior art processes, the temperature within crucible 14 is raised until source material 24 vaporizes and fills the interior of the crucible. In the off-set configuration of the present invention, seed 22 experiences a temperature gradient across its growing surface (as compared to prior art configurations which endeavored to maintain a relatively uniform, axi-symmetric temperature profile across the surface of the seed). In particular, there is known to be a radial component to the temperature gradient within crucible 14, defined as $\Delta T_R$, with a characteristic as shown in the plot of FIG. 4. Thus, in accordance with the principles of the present invention, there is a non-uniform temperature distribution across the surface of seed 22 when positioned off-center with respect to central vertical axis A of PVT growth apparatus 10.

The radial temperature gradient $\Delta T_R$ results in a non-uniform growth rate across the surface of seed 22, with a higher growth rate at the portion 22-1 closest to central vertical axis A. This radial temperature gradient as provided within the apparatus of the present invention facilitates the movement of atoms on the growth interface in the particular direction parallel to the radial gradient. During crystal growth, the vapor phase flux toward seed 22 is quite uniform, and the radial temperature gradient $\Delta T_R$ across the seed surface creates a net flow of surface atoms from the hotter region to the cooler region, which further results in a growth rate gradient across the seed surface. The gradient of growth rate generates many atomic steps, which bunch together to form macrosteps. The atoms adsorbed from the vapor phase on the growth interface move along the radial temperature gradient from the hotter area to the colder area. The macrosteps also move on the growth interface along the radial temperature gradient, but in the opposite direction from the atoms (i.e., from the colder area to the hotter area). This movement of macrosteps is called step-flow.

It is our understanding of the properties of the radial temperature gradient utilized by the method and apparatus of the present invention that the step-flow interacts with certain crystal defects (such as threading dislocations) and "bends" them in the direction of their movement. This "bending" adds a basal component to the threading dislocation, while the Burgers vector is preserved. The introduction of the radial temperature gradient in accordance with the present invention gradually reduces the overall density of crystal defects and thus improves crystal quality of the growing crystal.

It is advantageous to have a radial temperature gradient affecting the seed in the range of about 1 to 10° C./cm, and more preferably within the range of about 1 to 5° C./cm. When the radial gradient is too low, the rate of lateral step-flow is low and crystal quality improvement is insignificant. On the other hand, when the radial gradient is too high, the growth rate near the higher temperature side may be too low, thus effectively reducing the productivity of the growth process. Also, a too-high radial gradient can exacerbate crystal stress and generation of the basal plane dislocations. In the extreme cases, a too-high radial temperature gradient can cause the seed to evaporate at the high temperature area. Optimal radial temperature gradient can be achieved by proper design of the heating arrangement, crucible, and thermal insulation. Thermal modeling can be utilized to aid the design.

Figure 5:
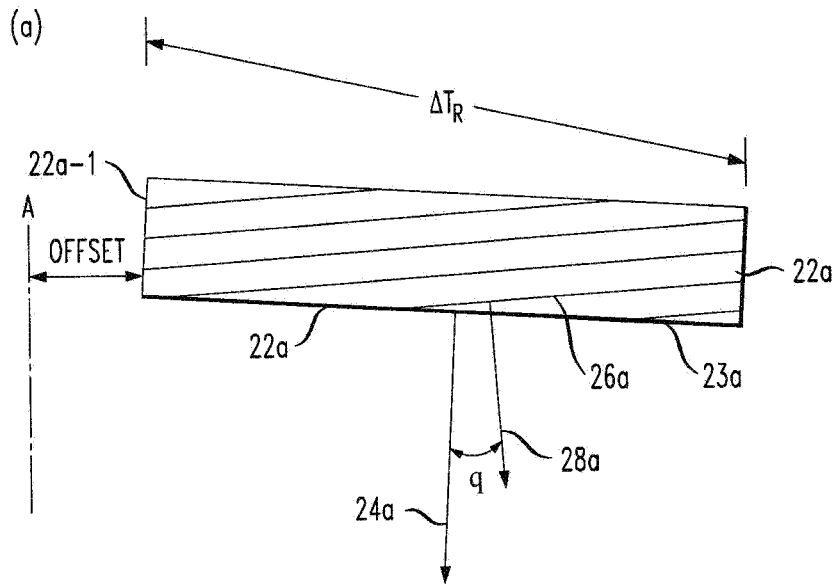
FIG. 5 illustrates various positions of the initial seed that may be used in an off-set seed fixture within the apparatus as shown in FIG. 3.
Figure 5:
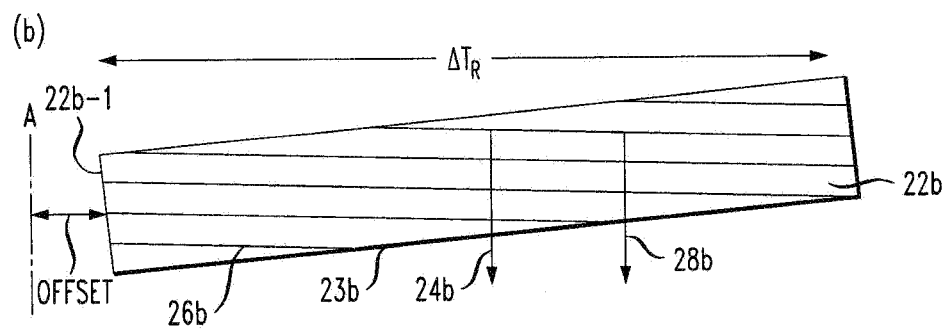
Figure 5:
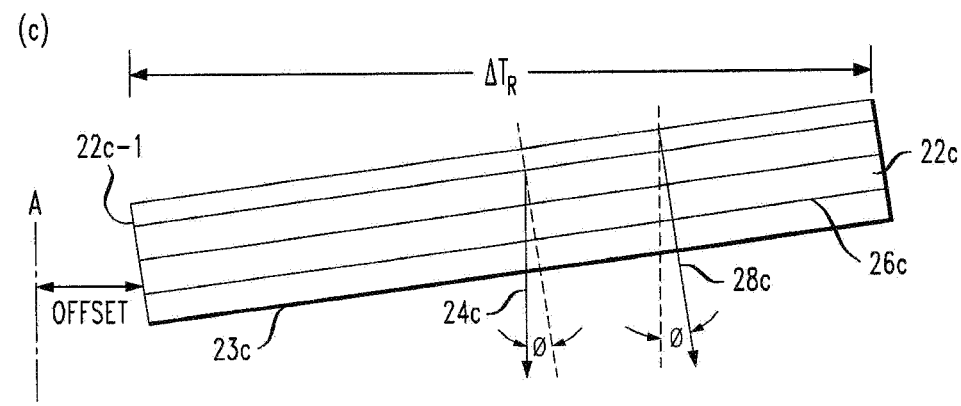

Advantageously, the apparatus as shown in FIG. 3 can be used with various configurations of seed crystal. FIG. 5 shows various positions of seed 22 that may be used in offset seed fixture 20. The radial off-set of seed 22 from vertical axis A is shown in each illustration (a), (b), and (c) in FIG. 5, as well as the radial temperature gradient experienced by seed 22. In illustration (a), seed 22a is depicted as an off-cut seed with a growing surface 26a at an angle θ with respect to the physical surfaces of seed 22a. In this particular configuration, seed 22a is positioned in a fixture such that a central axis 24a of a fixture exhibits an angle θ with respect to a growth axis 28a of seed 22a. In illustration (b) of FIG. 5, a seed 22b is also of an off-cut form, as shown by growing surface 26b. In contrast to the positioning shown in illustration (a), seed 22b is held within a fixture such that its growth axis 28b is parallel to central axis 24b of the fixture. Illustration (c) shows an exemplary embodiment where seed 22c does not have an off-cut form, but is instead configured such that its growing surface 26c is parallel to the physical surface of the seed. In this case, seed 22c is shown as being held in a fixture in a tilted configuration with respect to the plane perpendicular to central vertical axis A, creating an angle φ with respect to fixture axis 24c. If the seed is prepared to have an off-cut, it is preferred to place the seed in a way that the direction of the off-cut is parallel to the direction of the radial temperature gradient. Depending on the specifics of the source material and growth atmosphere, boules of various types may be formed. That is, semi-insulating boules, n-type boules, and p-type boules may all be formed, where each of these has been found to be of higher quality than the boules formed using prior art processes.

Figure 6:
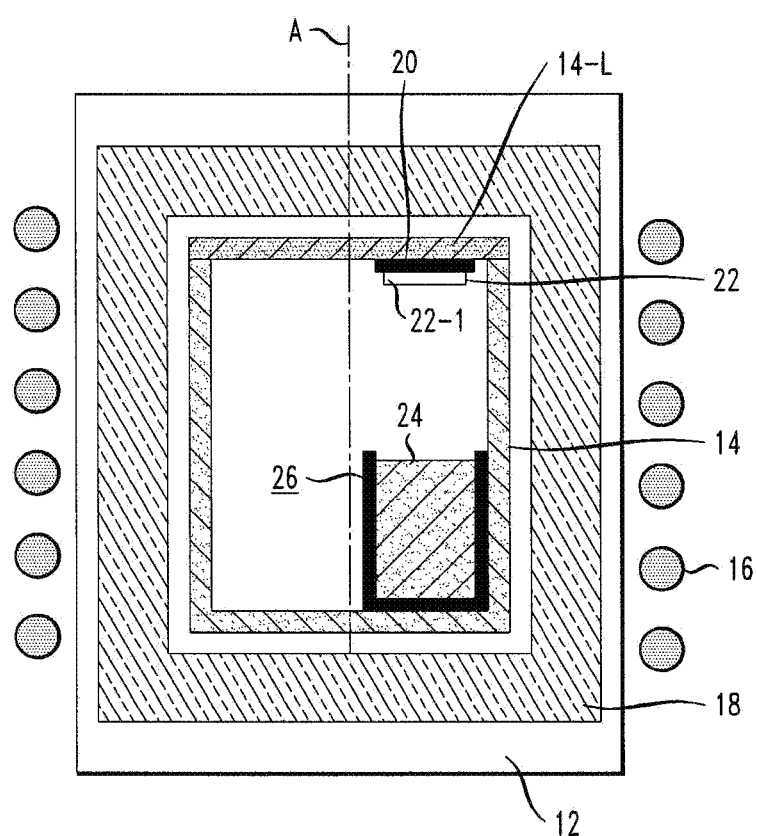
FIG. 6 illustrates an alternative embodiment of the present invention, utilizing a separate container for the sublimation source material which is itself located within a larger crucible.

FIG. 6 illustrates an alternative embodiment of the present invention, where in this configuration the source material is housed within a relatively small, separate open container 26. Container 26 is itself situated within crucible 14 in the manner shown. Container 26 is shown as also being disposed offset from central vertical axis A, in this case to be substantially aligned with the location of fixture 20 and seed 22.

Figure 7:
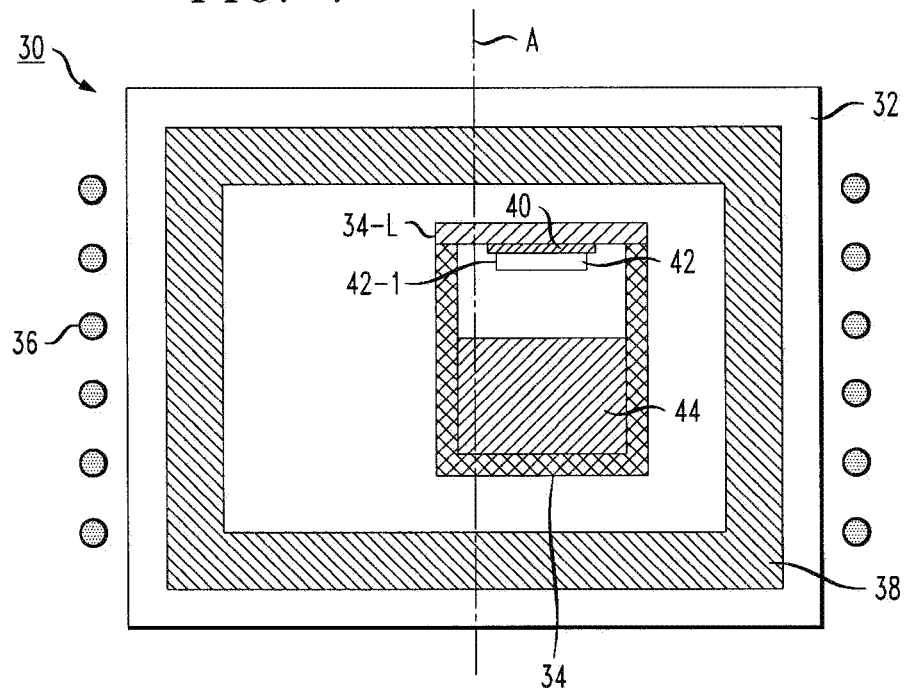
FIG. 7 illustrates yet another embodiment of the present invention, where in this configuration the crucible is displaced from the central vertical axis of the apparatus itself.

FIG. 7 illustrates another exemplary PVT growth apparatus 30 formed in accordance with the present invention to address various crystal quality concerns associated with prior art processes. Apparatus 30 is shown as including various components similar to those of the prior art as described above. In particular, apparatus 30 comprises a crystal growth chamber 32 with a crucible 34 for growing large, high quality boules of single crystal SiC. A heat source 36 (for example, inductive RF coils) is also shown in FIG. 7, with thermal insulation material 38 disposed to surround crucible 34. Other types of heat sources may be used in the inventive apparatus, for example, resistive.

In accordance with this embodiment of the present invention, cylindrical crucible 34 is itself displaced from the axi-symmetric position defined by central vertical axis A within apparatus 30. Referring to FIG. 7, a seed fixture 40 is placed axi-symmetrically within crucible 34, while crucible 34 itself is offset from central vertical axis A. A single crystal SiC seed 42 is held within fixture 40, facing downward toward a sublimation source material 44 loaded into crucible 34. In one embodiment, fixture 40 may be attached to an underside of a lid portion 34-L of crucible 34.

As with prior art processes, the temperature within crucible 34 is raised until source material 44 vaporizes and fills the interior of the crucible with the vapor. In the crucible off-set configuration of the present invention, seed 42 experiences a radial temperature gradient across its growing surface. There is known to be a non-uniform temperature distribution across the surface of seed 42 when crucible 34 positioned off-center with respect to heat source 36, as shown in FIG. 7.

The temperature gradient results in a non-uniform growth rate across the surface of seed 42, with a higher growth rate at the portion 42-1 closest to central vertical axis A. This temperature gradient promotes growth under conditions of strong lateral step-flow and thereby improves the crystal quality. It is advantageous to have a radial temperature gradient affecting the seed in the range of 1 to 10° C./cm (preferably 1 to 5° C./cm). Optimal radial temperature gradient can be achieved by careful design of the various components of the PVT growth apparatus (e.g., heating elements, growth chamber, crucible, insulation, etc.). Thermal modeling can be utilized to aid the design.

Figure 8:
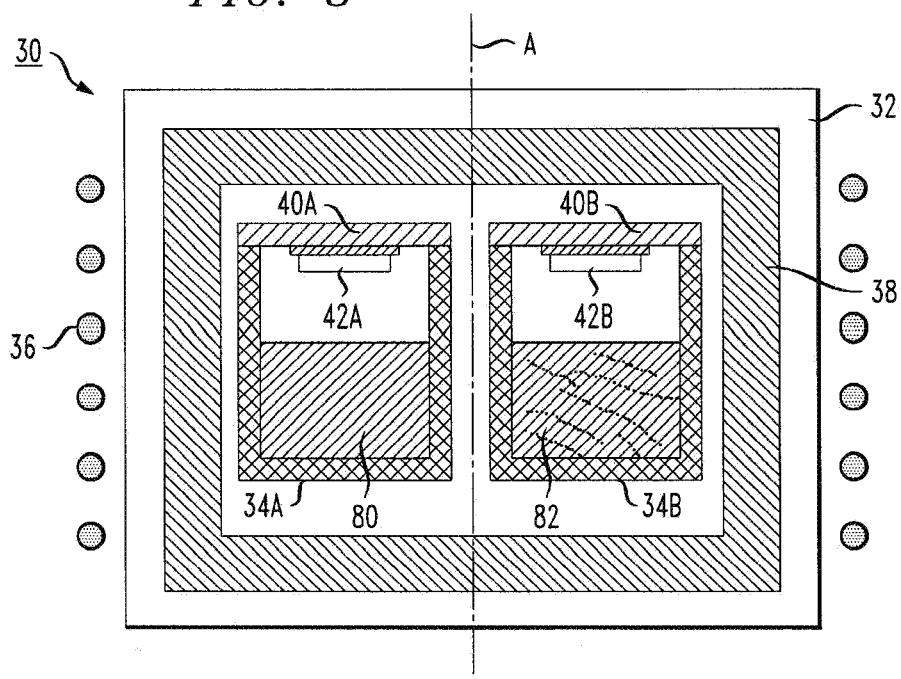
FIG. 8 shows an alternative configuration of the embodiment of FIG. 7, where multiple crucibles are located within the same apparatus, all displaced from the central vertical axis.

In another embodiment, crucible 34 can be rotated during crystal growth, including rotation around the vertical axis of crucible 34 and rotation around the vertical axis of heat source 36. Additionally, as shown in FIG. 8, the configuration of FIG. 7 can be modified to allow for more than one crucible to be disposed in the same apparatus and, therefore, used to form a number of separate SiC single crystal boules. In particular, the configuration of FIG. 8 shows an apparatus 30A where both a first crucible 34A and a second crucible 34B are disposed within the same growth chamber 32. Both crucibles 34A and 34B are displaced from the axi-symmetric position defined by central vertical axis A within apparatus 30A. Thus, a radial temperature gradient will be found across the surface of each seed 42A and 42B, providing the advantageous single crystal SiC growth techniques as discussed above. As with the configuration of FIG. 7, heat source 36 (for example, inductive RF coils) is used, with thermal insulation material 38 disposed to surround crucible 34 in the manner shown. Other types of heat sources may be used in the inventive apparatus, for example, resistive heating.

Figure 9:
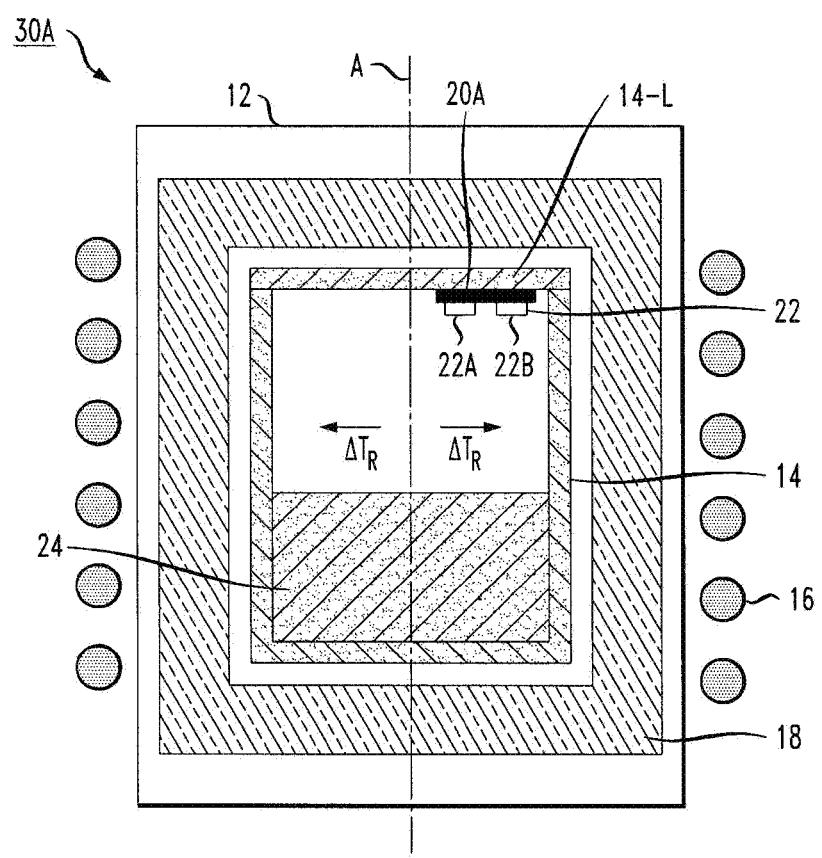
FIG. 9 illustrates an embodiment of the present invention where the seed fixture is configured to support two or more separate seed crystals.

FIG. 9 illustrates yet another embodiment of the present invention that may be configured to use more than one seed and, therefore, grow more than one single crystal SiC boule. The apparatus of FIG. 9 is similar to that of FIG. 3, however in this case fixture 20 is configured to support at least two separate seed crystals, shown as seed crystals 22A and 22B. The seeds may exhibit a same orientation, or different orientations may be used (see, for example, the various seed orientations as shown in FIG. 5).

The SiC single crystal boules grown using the disclosed embodiments are typically ground to a desired diameter such as 3", 100 mm, 150 mm, 200 mm and 300 mm. The boules are oriented using an x-ray diffraction tool. Then, flats or notches are produced on the boules in accordance with the crystal orientation. Finally, the boules are sliced into multiple wafers using, for example, a diamond multi-wire saw.

In various specific embodiments of present invention, the growth apparatus may be particularly configured for large-diameter crystal growth (for example, for the production of the above-mentioned 150 mm, 200 mm and 300 mm SiC wafers). Alternatively, the same growth apparatus can be used to grow one or more smaller diameter crystals, for example, for the production of one or more 100 mm SiC wafers. In the latter case, a single fixture can be used to hold the one or more seeds in positions that remain offset from the central vertical axis of the apparatus. Various types of rotational motion may be imparted to the seed-holding fixture to provide additional variations to the radial temperature gradient experienced by each seed (and the crystal formation forming on each seed) during the growth process.

Figure 10:
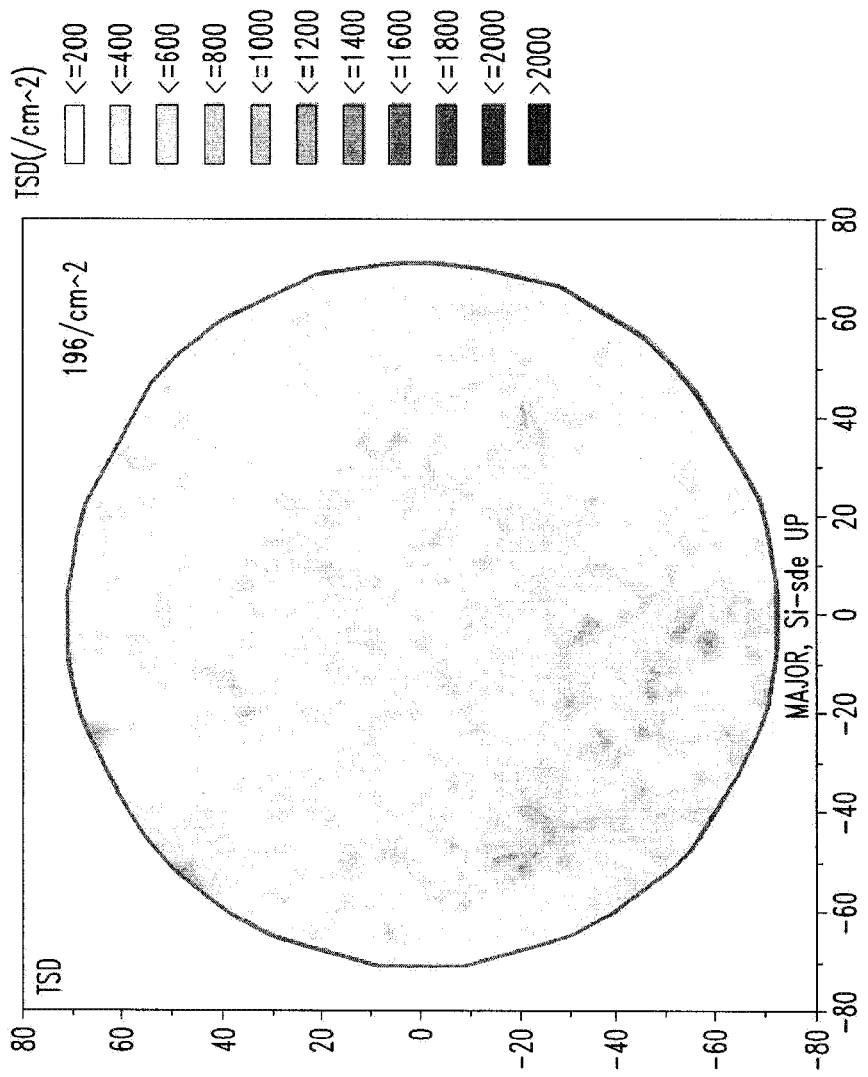
FIG. 10 is a contour map of threading screw dislocation density for a wafer sliced from a boule of single crystal SiC grown in the apparatus of the present invention.
Figure 11:
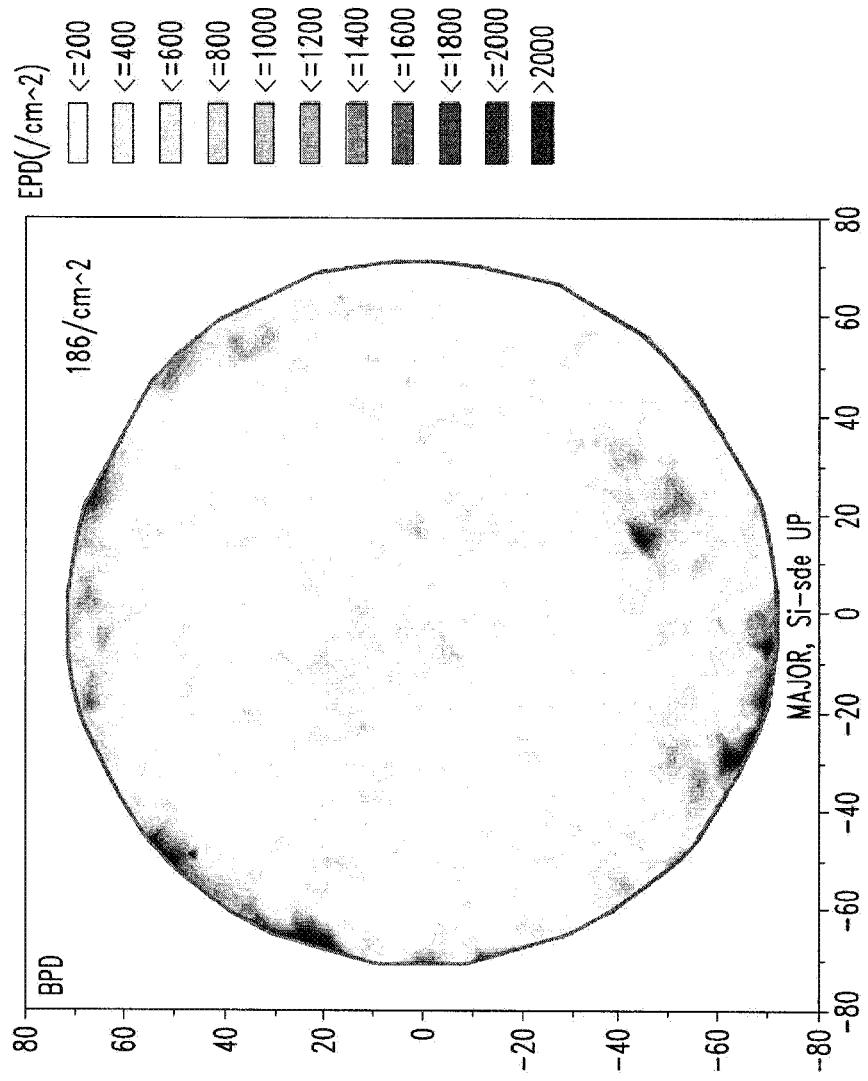
FIG. 11 is a contour map of basal plane dislocation density for the same wafer as shown in FIG. 10.

The densities of crystal defects in SiC wafers, in particular, threading screw dislocation density (TSD) and basal plane dislocation density (BPD), are important for the device performance. SiC wafers produced according to the principles of the present invention have lower defect densities than those produced by the methods of prior art. FIG. 10 shows a contour map of the threading screw dislocation density for a wafer sliced from boule of single crystal SiC grown according to the present invention. One can see that the TSD is uniformly low with an average density of 196 $cm^{-2}$. FIG. 11 shows a contour map of the basal plane dislocation density of the same wafer. The average BPD of the wafer is 182 $cm^{-2}$. For comparison purposes, a SiC crystal was grown using conventional PVT growth of prior art on a seed very similar to that used to for the growth of aforementioned boule formed in accordance with the present invention. This conventional PVT growth yielded a boule containing 3-4 times higher defect densities: TSD of 800 $cm^{-2}$ and BPD of 512 $cm^{-2}$.

What is claimed is:

1. A physical vapor transport (PVT) apparatus for growing SiC boules, comprising:
    a crystal growth chamber defined as having a central vertical axis;
    a sealed crucible disposed within the crystal growth chamber and configured to support a quantity of sublimation source material disposed in a lower region thereof, the sealed crucible further comprising
    a seed fixture disposed above the lower region and disposed in an offset position
    with respect to the central vertical axis of the crystal growth chamber; and
    a heat source disposed to surround the crystal growth chamber and configured to raise a temperature within the sealed crucible such that the source material vaporizes and deposits on a seed wafer included within the seed fixture, the offset position of the seed fixture providing a radial temperature gradient across an exposed surface thereof.

2. The PVT apparatus as defined in claim 1 wherein the crucible is aligned with the central vertical axis.

3. The PVT apparatus as defined in claim 1 wherein the crucible includes an open container for storing the sublimation source material.

4. The PVT apparatus as defined in claim 3 wherein the open container is offset from the central vertical axis.

5. The PVT apparatus as defined in claim 3 wherein the open container is aligned with the seed fixture.

6. The PVT apparatus as defined in claim 1 wherein the seed fixture comprises a single fixture component.

7. The PVT apparatus as defined in claim 6 wherein the single fixture component is configured to support an individual single crystal seed wafer.

8. The PVT apparatus as defined in claim 6 wherein the single fixture component is configured to support a plurality of separate single crystal seed wafers in a spaced-apart arrangement.

9. The PVT apparatus as defined in claim 1 wherein the seed fixture comprises a plurality of separate fixture components, each separate fixture component offset from the central vertical axis.

10. The PVT apparatus as defined in claim 9 wherein each separate fixture component is configured to support an individual single crystal seed wafer.

11. The PVT apparatus as defined in claim 9 wherein each separate fixture component is configured to support a plurality of separate single crystal seed wafers in a spaced-apart arrangement.

12. The PVT apparatus as defined in claim 1 wherein the crucible comprises a plurality of separate crucible components, each separate crucible component disposed within the crystal growth chamber such that its associated seed fixture is disposed in an offset position with respect to the central vertical axis of the growth chamber.

13. The PVT apparatus as defined in claim 12 wherein each crucible component utilizes a different sublimation source material.

14. The PVT apparatus as defined in claim 1 wherein the heat source is selected from the group consisting of: inductive RF coils and resistive heaters.

15. A method of growing silicon carbide single crystal boules from a single crystal seed wafer, comprising:
positioning a crucible loaded with sublimation source material into a crystal growth chamber, the crystal growth chamber having a central vertical axis;
loading at least one single crystal seed wafer onto a seed fixture;
positioning the loaded seed fixture in the crucible in a manner such that the loaded seed fixture is offset from the central vertical axis of the crystal growth chamber;
sealing the crucible; and
heating the crystal growth chamber to a temperature sufficient to initiate sublimation of the source material and create vapors that rise and deposit on an exposed surface of the seed wafer and result in growing the boule, the heating creating a radial temperature gradient across the exposed surface of the seed wafer related to the offset location of the seed fixture with respect to the central vertical axis of the crystal growth chamber.

16. The method as defined in claim 15 wherein the loading step comprises loading a plurality of separate seed wafers in a spaced-apart configuration onto the seed fixture.

17. A method of growing silicon carbide single crystal boules from a single crystal seed wafer, comprising:
positioning a plurality of separate crucibles loaded with sublimation source material into a crystal growth chamber, the crystal growth chamber having a central vertical axis;
providing a plurality of separate seed fixtures, associated with the plurality of separate crucibles in a one-to-one relationship;
loading at least one single crystal seed wafer onto each separate seed fixture of the plurality of separate seed fixtures;
positioning each loaded seed fixture in its associated crucible in a manner such that the loaded seed fixture is offset from the central vertical axis of the crystal growth chamber;
sealing the plurality of separate crucibles; and
heating the crystal growth chamber to a temperature sufficient to initiate sublimation of the source material within each crucible and create vapors that rise and deposit on an exposed surface of the seed wafer within each crucible and result in growing an associated boule, the heating creating a radial temperature gradient across the exposed surface of each seed wafer related to the offset location of each seed fixture with respect to the central vertical axis of the crystal growth chamber.

18. The method as defined in claim 17 wherein each crucible of the plurality of separate crucibles is loaded with a different sublimation source material.

* * * * *